(12) United States Patent
Crabtree et al.

(10) Patent No.: US 9,429,631 B2
(45) Date of Patent: Aug. 30, 2016

(54) DEVICE AND METHOD FOR ALTERING THE PATH OF RADIO WAVES TO RECORD THE IMAGE INFORMATION AVAILABLE IN SAID WAVES

(76) Inventors: William Patrick Crabtree, Portland, OR (US); Lance Thomas Haubrick, Flagstaff, AZ (US)

(*) Notice: Subject to any disclaimer, the term of this patent is extended or adjusted under 35 U.S.C. 154(b) by 1388 days.

(21) Appl. No.: 12/650,696

(22) Filed: Dec. 31, 2009

(65) Prior Publication Data

US 2010/0097291 A1   Apr. 22, 2010

Related U.S. Application Data

(63) Continuation-in-part of application No. 11/853,650, filed on Sep. 11, 2007, now abandoned.

(51) Int. Cl.
  *H01Q 15/02* (2006.01)
  *G01R 33/032* (2006.01)
  *G03B 27/32* (2006.01)

(52) U.S. Cl.
  CPC .............. *G01R 33/032* (2013.01); *G03B 27/32* (2013.01)

(58) Field of Classification Search
  CPC .......... H01Q 3/34; H01Q 3/46; H01Q 15/02; H01Q 15/04; H01Q 19/06; H01Q 21/0031; H01Q 25/008
  USPC ............. 343/909, 753, 754, 755, 910, 911 R, 343/911 L
  See application file for complete search history.

(56) References Cited

U.S. PATENT DOCUMENTS

| | | | |
|---|---|---|---|
| 3,387,241 A | | 6/1968 | Audoin |
| 3,787,872 A | * | 1/1974 | Kauffman ................ 343/911 R |
| 3,859,613 A | | 1/1975 | Blamoutier |
| 4,095,201 A | | 6/1978 | Kervizic |
| 4,458,249 A | * | 7/1984 | Valentino et al. ............ 343/754 |
| 4,668,078 A | | 5/1987 | Pearson |
| 4,859,976 A | | 8/1989 | Leupold |
| 5,057,738 A | | 10/1991 | Boerekamp |
| 5,105,120 A | | 4/1992 | Nishioka |
| 6,115,195 A | | 9/2000 | Winters |
| 6,225,957 B1 | * | 5/2001 | Yamaguchi .................. 343/755 |
| 6,830,783 B2 | | 12/2004 | Fukui |
| 7,067,820 B2 | | 6/2006 | Buijsse |
| 7,092,144 B2 | | 8/2006 | Blum |

(Continued)

FOREIGN PATENT DOCUMENTS

WO   WO2006018956   2/2006

OTHER PUBLICATIONS

Patrick L. Ryan, Radio Frequency Propagation Differences Through Various Transmissive Materials, Dec. 2002, University of North Texas, p. 6.*

(Continued)

*Primary Examiner* — Sue A Purvis
*Assistant Examiner* — Patrick Holecek

(57) ABSTRACT

A device and related method for refracting radio waves to enable the temporary or permanent recording of said waves. The device includes a piece of material that is transparent or translucent to radio waves. The piece of material, which may be solid, is selected to have an inherent radio wave refraction index greater than a value of one for either its transparent or translucent state. The radio waves are selectively passed through the material and recorded on a translation medium for observation.

14 Claims, 4 Drawing Sheets

(56) References Cited

U.S. PATENT DOCUMENTS

| | | |
|---|---|---|
| 7,220,488 B2 | 5/2007 | Wadle |
| 2003/0060987 A1 | 3/2003 | Dao |
| 2006/0045543 A1 | 3/2006 | Kato |

OTHER PUBLICATIONS

PCT ISA/US, International Search Report and Written Opinion, Oct. 22, 2008, 5 pp. US.
http://www4.hmc.edu:8001/humanities/beckman/artclasses/chemistry.htm Provided with the IDS.
www.augustatech.edu/chemistry/blackand.htm Provided with the IDS.
http://www.optics.rochester.edu/workgroups/cml/opt307/spr04/jidong/ Provided with the IDS.
http://www.kodak.com/global/en/consumer/education/lessonPlans/lessonPlan152.shtml Provided with the IDS.
Iizuka, Keigo; "A Method for Photographing Microwave With a Polaroid Film", Published in Mar. 1968 by Division of Engineering and Applied Physics, Harvard Univserity, Cambridge, MA. Technical Report No. 558.
http://www2.jpl.nasa.gov/radioastronomy/radioastronomy_all.pdf, specifically p. 10 which mentions that radio waves have no discernable effect on the film emulsion. This is the Miller, D, "Basics of Radio Astronomy for the Goldstone-Apply Valley Radio Telescope" report.
https://www.lhup.edu/~dsimanek/scenario/labman3/thinlens.htm Relevant pages is 2, 3, and 4. Full document provided. L-2 Thin Lenses.
https://www.lhup.edu/~dsimanek/glossary.htm Only page with the definition of image to support the prior response on Oct. 22, 2014 Definition of Image provided by Lock Haven University.
Lecture #3 Crystal Structures of Metals from University of Washington.

* cited by examiner

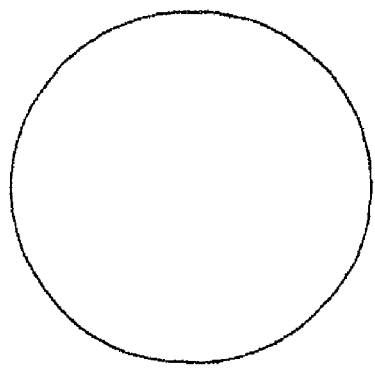 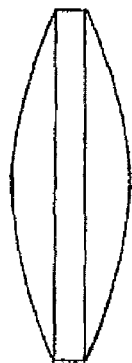 
FIG 1A   FIG 1B   FIG 1C
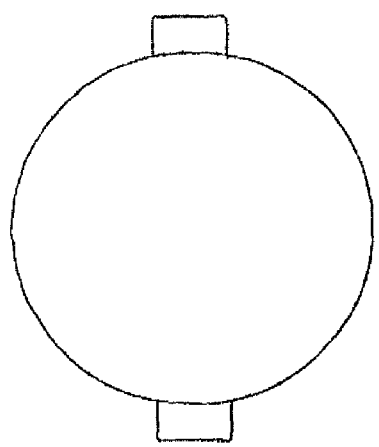 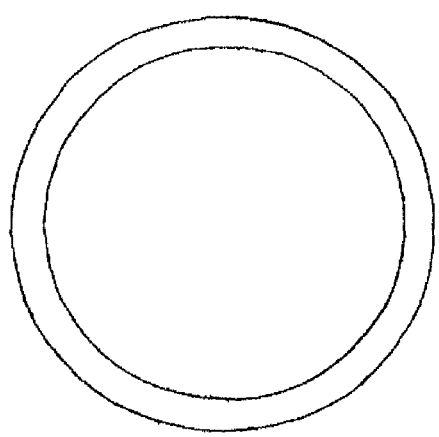
FIG 2A   FIG 2B

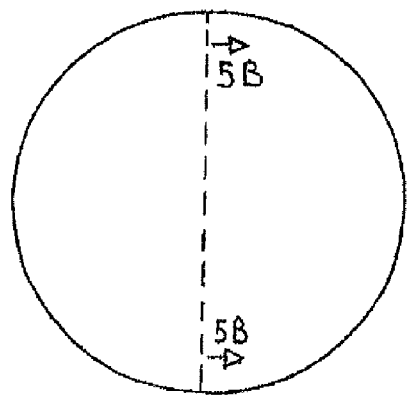 
FIG 5A   FIG 5B
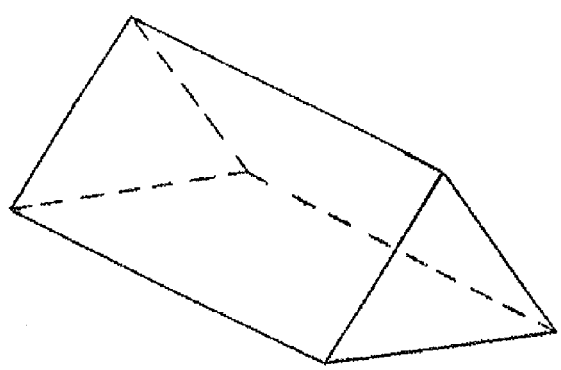 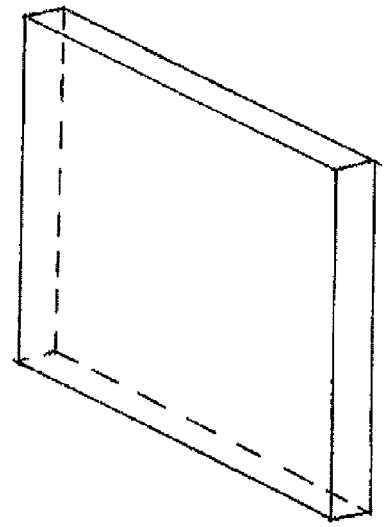
FIG 6   FIG 7

DEVICE AND METHOD FOR ALTERING THE PATH OF RADIO WAVES TO RECORD THE IMAGE INFORMATION AVAILABLE IN SAID WAVES

CROSS REFERENCE TO RELATED APPLICATION

This application is a continuation-in-part, and claims the priority benefit, of U.S. nonprovisional patent application Ser. No. 11/853,650, filed Sep. 11, 2007, entitled "Device and Method for Altering the Path of Magnetic Waves to Record the Activity Thereof" of the same named inventors. The content of that application is incorporated herein by reference.

BACKGROUND OF THE INVENTION

1. Field of the Invention

This technology reveals previously undiscovered independent behavior of radio waves and light waves. This behavior is manifested as an ability of the waves in one category to negate or reverse the effect of the waves in the other category at the molecular level. Specifically, the invention relates to the manipulation of radio waves to obtain new information about materials that they have reflected from, passed through, or originated from.

In 1864, James Clerk Maxwell published a paper that explained light as the propagation of electromagnetic waves. Mr. Maxwell stated, "The agreement of the results seems to show that light and magnetism are affections of the same substance, and that light is an electromagnetic disturbance propagated through the field according to electromagnetic laws." Maxwell's equations demonstrated that light waves and radio waves propagate at the same speed and both have the "bootstrap" components well know to those skilled in the art.

The equations derived by Maxwell and interpreted by concluding light to be an electromagnetic wave in the electromagnetic spectrum can also be interpreted by an alternate conclusion that magnetic phenomena and light phenomena have wave components that obey the same physical laws of bootstrap propagation but that the components of light waves are not electromagnetic. That is, radio waves and light waves are different energy frequency spectrums that can co-exist and interact but are not "affections of the same substance." The data obtained by the current embodiment of the invention are in agreement with this hypothesis. Whether this view point is correct and the conventional EM (electromagnetic) spectrum is more complicated than a straight line or physicists develop a theoretical patch that will maintain the status quo will be decided by future research.

Materials exist that are transparent or translucent to light and possess properties causing them to refract, reflect, absorb, or perform a combination of these actions on light waves. A logical derivative of the alternate interpretation noted above is that materials that are transparent or translucent to radio waves and possess properties causing them to refract, reflect, absorb, or perform a combination of these actions on radio waves also must exist. A second derivative is that due to the original interpretation of Maxwell's equations, a lack of sensory information relating to the immediate environment and the universe in general has been missing. Without the alternate interpretation the existence of radio waves independent of light waves is not obvious within the consensus of traditional physics belief and no attempts to detect any difference between them has been made since the time of Maxwell.

It is to be noted analogously with respect to the concept of an alternative interpretation that oxygen and nitrogen have the laws of gases in common yet have other characteristics showing a difference. The data obtained by the use of the current prototype of one embodiment of the present invention show that a previously undiscovered characteristic of radio waves and light waves exists by virtue of one negating the effect on molecules of the other, this reveals a difference between them. In the following sections the phrase "magnetic spectrum" will be used when referring to the radio wave band of the conventional EM spectrum to remind the reader that the data yield may represent the first detected difference between radio waves and light waves. In addition, the phrase "radio wave refraction index" refers herein to a property inherent in a material which causes radio waves in the magnetic spectrum to change speed as they enter or exit the material resulting in a change of direction.

As a result of Maxwell's conclusions, all bands of the conventional EM spectrum (i.e., radio waves, infra red light, visible light, ultraviolet light, X-rays and gamma ray, etc.) were all viewed as an electromagnetic wave differentiated only by frequency and method of artificial generation. Therefore, one past scientific assumption made is that all members of this single spectrum are an electromagnetic wave and would have the same effect at the molecular level on a film emulsion.

Scientists made the assumption that all of the spectrum members would cause the film emulsion to become resistive to the developing chemical as demonstrated by the known effect of visible light waves. While past experiments showed that the majority of the spectrum bands (i.e., light waves, X rays, gamma rays, etc) cause the film emulsion to become resistive to the developing chemical, radio waves were shown to have no discernable effect on photographic plates as referenced in a published paper by Miller, D., "*Basics of Radio Astronomy for the Goldstone Apple Valley Radio Telescope*".

Since radio waves were believed to have no effect on the film emulsion, a general explanation was adopted by the scientific community indicating that lower frequency waves do not have enough energy to overcome the initial resistance or enthalpy to cause an observable reaction on the film emulsion. Equations developed were based on the assumption that all possible observations had been made.

The results of experiments conducted with a prototype of one embodiment of the present invention demonstrate that radio waves instead have the opposite effect compared to light waves and cause the film emulsion molecules to become more reactive to the developing chemical. The radio waves can also cancel out the effects of light on film emulsion which has been uniformly pre-exposed to light waves prior to exposure to radio waves. These experiments used a silver halide for the emulsion molecules making the possibility that the radio waves affect the silver atoms while the light waves affect the halide atoms a feasible explanation for this phenomena.

2. Description of the Prior Art

The nearest prior art is that of microwave lenses. There are many designs for these devices well known to those skilled in the art. The common feature existing in microwave lenses is that of electrically charged plates. The first designs resulted in a negative refraction index for radio waves followed by designs resulting in both negative and positive refraction depending on the radio wave frequency. The later design has a narrow frequency range between the negative and positive ranges where the radio waves do not pass. This is similar to the description of a band-stop filter in an electronic circuit. A capacitor receiving electrical charges on one plate from several sources simultaneously will release a sum charge from the other plate. Microwave lenses receiving a multitude of radio waves simultaneously on one side will emit a sum radio wave on the other side, thus erasing any image information riding the radio waves. They can only be used to facilitate the operation of devices that detect signal amplitude. This is not refraction in the sense of the refraction of light passing through a glass lens.

The current prototype of one embodiment of the present invention does refract radio waves in the same manner that a glass lens refracts light. Just as with light, the radio wave refraction index of a vacuum equals one. The material used is opaque to light yet transparent or translucent to radio waves, has a radio wave refraction index greater than one inherent in the material, and does not erase the image information riding the radio waves. Embodiments of this invention can be classed as passive devices, that is, they are not energized by electric charges, magnetic fields, or other means, in order to function. Since radio waves and light waves obey the same physical laws, other embodiments can be obtained by applying the principles of optics, which guide the design of devices affecting light, to obtain the desired effect on radio waves.

SUMMARY OF THE INVENTION

The present invention is a device and related method for altering the path of radio waves existing in the magnetic spectrum so as to enable the temporary or permanent recording of image information carried by said waves. The device includes a piece of material that is transparent or translucent to radio waves. The piece of material, which may be a single solid piece or formed of a plurality of pieces layered together, has two or more surface areas providing for the radio waves to enter and exit with one or more entrances into and one or more exits from the material. The material is selected for its inherent radio wave refraction index greater than a value of one for either its transparent or translucent state.

The related method includes the step of selectively passing the radio waves through the material such that all radio wave frequencies pass through the material for the transparent state, and less than all radio waves frequencies pass through the material for the translucent state. The method further includes the step of directing the radio waves to a translation medium which makes the image information carried by the radio waves perceivable to a human observer. The medium, which may include, but not be limited to, photographic film, digital micro sensor grids, or any other medium capable of translating said image information, is selected to enable the temporary or permanent recording of image information about materials that the radio waves have reflected from, passed through, or objects they have originated from.

In accordance with one embodiment of the present invention, the device portion for refracting radio waves comprising a solid piece of material with an inherent radio wave refraction index greater than a value of one is shaped as a biconvex lens. Other embodiments are described and shown herein and the advantages of the invention will become more apparent upon review of the following detailed description, the accompanying drawings and the appended claims. In the following description of the present invention the device portions of the embodiments are referred to by the names magnegraphic lens, magnegraphic prism, or magnegraphic filter, while all embodiments are referred to by the phrase "magnegraphic device." The method portion of any embodiment of the present invention, the manner in which it is used, is determined by the geometry of the device portion of that embodiment and is expressed in the name chosen for the device portion. The term "magne" from magnetic and "graphic" combining to form the word magnegraphic is an analogy with "photo" from photon and "graphic" combining to form the word photographic.

BRIEF DESCRIPTION OF THE DRAWINGS

FIG. 1A shows the front or back view and FIG. 1B shows a side view perpendicular to the front and back sides of a magnegraphic lens, one embodiment of a magnegraphic device. FIG. 1C illustrates minimum thickness values.

FIG. 2A shows a front view of a lens disk with mounting tabs. FIG. 2B shows a front view of a lens disk with an encircling mounting rim.

FIG. 5A shows the front or back view and FIG. 5B shows the cross section view perpendicular to the front and back sides of a magnegraphic lens, one embodiment of a magnegraphic device.

FIG. 6 shows a perspective view of a magnegraphic prism, one embodiment of a magnegraphic device.

FIG. 7 shows a perspective view of a magnegraphic filter, one embodiment of a magnegraphic device.

DETAILED DESCRIPTION OF THE PREFERRED EMBODIMENTS OF THE INVENTION

Bi-Convex Embodiment—FIGS. 1A and 1B

FIG. 1A shows the front or back view and FIG. 1B shows a side view perpendicular to the front and back sides of a first embodiment of a magnegraphic device of the present invention as a first magnegraphic lens configuration. This embodiment is a lens, convex on both sides, made from a single piece of material. The radius of curvature of each of its convex sides, its thickness, and its diameter, may be varied. The curvature may be adjusted to eliminate spherical aberration (not shown). This embodiment can be made of various materials, although metals and their alloys may be preferred.

The geometry of the magnegraphic lens shown is that of a circular disk with curved sides (FIG. 1A). Many other geometries such as oval, triangle, square etc, may be used but will complicate the curving of the front or back sides, which may distort images, which distortion must be taken into account. The thickness of the lens at its center and rim can vary (FIG. 1B and FIG. 1C), but have minimum values imposed by its diameter and the radius of curvature selected for the curved surfaces.

The embodiment of the magnegraphic lens shown in FIGS. 1A-1C may be attached by screws, straps, clamps, or other attachment means or methods to a support structure suited to the application. A second related embodiment of the magnegraphic lens may also have tabs (FIG. 2A), or a single continuous protrusion (FIG. 2B) completely encircling the rim, to facilitate the use of screws, clamps, straps, etc. The inclusion of such means for attachment or other means of attachment to a suitable or desired support structure may be applied to all other embodiments of a magnegraphic lens as described herein.

Bi-Convex Operation

This embodiment of the present invention causes the radio waves to converge, resulting in a focused image. Its magnetic spectrum focal length is the shortest of any embodiment provided that the radius of curvature of the convex sides and material used in other embodiments are identical.

Figure 3A:
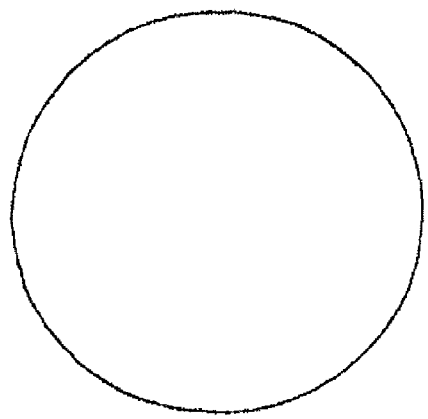
FIG. 3A shows the front or back view and FIG. 3B shows a side view perpendicular to the front and back sides of a magnegraphic lens, one embodiment of a magnegraphic device.
Figure 3B:

Planar Convex Embodiment—FIGS. 3A and 3B

FIG. 3A shows the front or back view and FIG. 3B shows a side view perpendicular to the front and back sides of a second embodiment of the magnegraphic device as a second magnegraphic lens configuration. This embodiment is a lens, convex on one side and flat on the other side, made from a single piece of material. The radius of curvature of its convex side, its thickness, and its diameter, may be varied. The curvature may be adjusted to eliminate spherical aberration (not shown). This embodiment can be made of various materials, although metals and their alloys may be preferred. This embodiment may be attached by screws, straps, clamps, or other methods to a support structure suited to the application.

Planar Convex Operation

This second embodiment of the invention causes the radio waves to converge, resulting in a focused image. Its magnetic spectrum focal length is longer than the bi-convex embodiment provided that the radius of curvature of the convex sides and material used are identical.

Figure 4A:
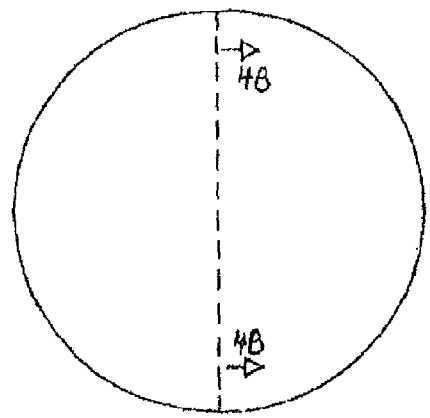
FIG. 4A shows the front or back view and FIG. 4B shows the cross section view perpendicular to the front and back sides of a magnegraphic lens, one embodiment of a magnegraphic device.
Figure 4B:
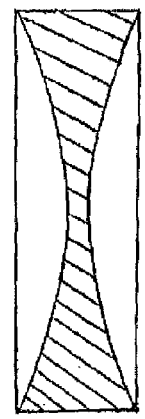

Bi-Concave Embodiment—FIGS. 4A and 4B

FIG. 4A shows the front or back view and FIG. 4B shows the cross section view perpendicular to the front and back sides of a third embodiment of the magnegraphic device of the present invention as a third magnegraphic lens configuration. This embodiment is a lens, concave on both sides, made from a single piece of material. The radius of curvature of each of its concave sides, its thickness, and its diameter, may be varied. The curvature may be adjusted to eliminate spherical aberration (not shown). This embodiment can be made of various materials, although metals and their alloys may be preferred. This embodiment may be attached by screws, straps, clamps, or other methods to a support structure suited to the application.

Bi-Concave Operation

This embodiment causes the radio waves to diverge.

Planar Concave Embodiment—FIGS. 5A and 5B

FIG. 5A shows the front or back view and FIG. 5B shows the cross section view perpendicular to the front and back sides of a fourth embodiment of the magnegraphic device of the present invention as a fourth magnegraphic lens configuration. This embodiment is a lens, concave on one side and flat on the other side, made from a single piece of material. The radius of curvature of its concave side, its thickness, and its diameter, may be varied. The curvature may be adjusted to eliminate spherical aberration (not shown). This embodiment can be made of various materials, although metals and their alloys may be preferred. This embodiment may be attached by screws, straps, clamps, or other methods to a support structure suited to the application.

Planar Concave Operation

This embodiment causes the radio waves to diverge.

Prism Embodiment—FIG. 6

FIG. 6 shows a perspective view of a fifth embodiment of the magnegraphic device of the present invention as a magnegraphic prism. This embodiment is a prism made from a single piece of material with three or more flat surfaces forming a triangle, rectangle, pentagon, etc in cross section with two ends which are flat and parallel to the plane of the cross section. Its length end to end, the angular relationship of the sides forming the cross section, and its greatest thickness may be varied. This embodiment can be made of various materials, although metals and their alloys may be preferred. This embodiment may be attached by screws, straps, clamps, or other methods to a support structure suited to the application.

Prism Operation

This embodiment refracts a beam of radio waves unequally resulting in a display of the magnetic spectrum from lowest to highest frequency.

Filter Embodiment—FIG. 7

FIG. 7 shows a perspective view of a sixth embodiment of the magnegraphic device of the present invention as a magnegraphic filter. This embodiment is a plate, made from a single piece of material with two flat parallel surfaces and may be formed as a square, circular, oval, etc plate. The dimensions of this embodiment can be varied. This embodiment may be attached by screws, straps, clamps, or other methods to a support structure suited to the application.

Filter Operation

This embodiment significantly reflects or absorbs some but not all radio waves. It thus acts as a filter. The radio wave frequencies reflected or absorbed will be determined by the material which is selected.

Experimental Setup and Results

Figure 8:
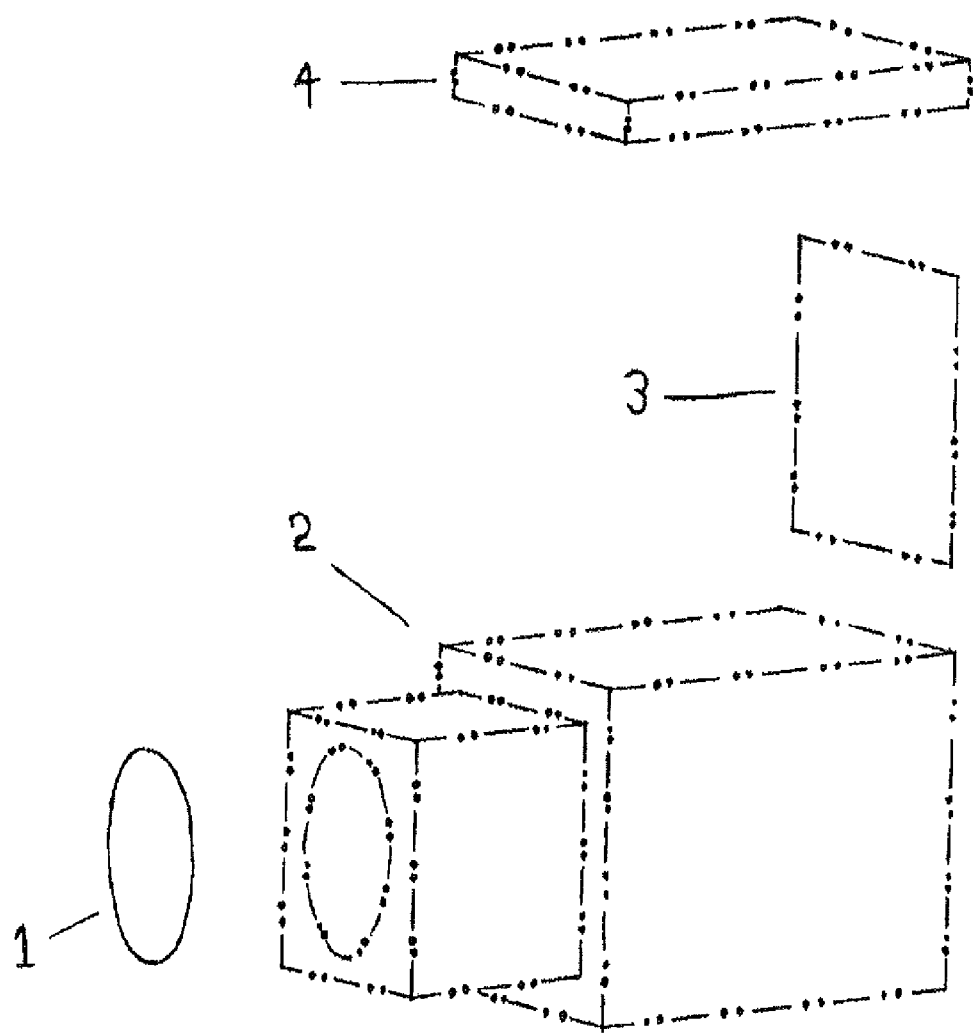
FIG. 8 shows a simplified perspective representation of a magnegraphic lens of a prototype of one embodiment of the present invention used in combination with a support structure and recording medium.

A functioning prototype, the (Magnegraphic Camera Unit) MCU Mark 1c, of the bi-convex embodiment (FIG. 8) has been constructed by taking a box camera and replacing the glass lens with an Aluminum alloy magnegraphic lens (1). The Aluminum Alloy used for the prototype was 6061-T6511, which was selected for hardness and its commercial availability not for an expected optimum performance. It is to be understood that other materials may be used to construct a magnegraphic device, provided they have a radio wave refraction index inherent in the material greater than one. The prototype lens (1) was shaped on a lathe and polished to a mirror finish using well known metal polishing methods. The number of defects in the surfaces of the magnegraphic lens were minimized as much as reasonably possible. The magnegraphic lens (1) was then coated with a polymer layer, which is only needed when a material selected to form the magnegraphic lens oxidizes easily. Therefore, a polymer layer may not always be required.

The support structure, a box (2) with a light-proof lid (4), was selected for its compatibility with the selected permanent recording medium, which was a sheet of black and white film (3). The film (3) used for the prototype was a Silver Halide film with high Silver content. More specifically, the film used as the recording medium was Efke EFPL50M4550 PL 50 M a 4"×5" black and white film. It is to be understood that other recording media and/or other support structures may be employed without deviating from the primary concept of the present invention, which is the use of a magnegraphic lens or magnegraphic filter arranged to allow some or all radio waves to pass therethrough for recording, permanently or temporarily, on a translation medium.

Several series of experimental exposures to radio waves, both low and high frequencies were performed using the prototype to verify the concept embodied by the invention. In the course of developing the prototype for the purpose of focusing radio waves on the translation medium, it was determined that pre-exposure of the film to diffuse light was required to ensure that the image information content of radio waves generated by, reflecting from, or passing through an object under observation would be viewable on the film after exposure to the radio waves passing through the magnegraphic lens.

This first prototype of one embodiment of the present invention operates by focusing radio waves in the same manner that a glass lens focuses light. The functioning prototype has focused images of the sun and other objects radiating radio waves. The radio waves have an effect on the black and white film opposite to that of light; the film emulsion became more reactive to the developing chemical not less. In addition, if the film is exposed to diffuse light beforehand, the radio waves focused by the magnegraphic lens negate the effect of the light. The magnegraphic image obtained is thus a positive image. Without pre-exposure to light the emulsion in the areas affected by the radio waves dissolve in the developing chemical first followed by the remainder of the emulsion, producing a blank.

Several variables were examined during these efforts, time of pre-exposure to light, pre-exposure with different bands within the light spectrum, time of exposure to radio waves, exposure to different radio wave frequencies, and the lens maker variables in the equation $1/f=1/p+1/i$, where i equals the distance of the magnegraphic lens to film, p equals the distance from the magnegraphic lens to the reflector or source, and f equals the primary focal length of the magnegraphic lens.

The radio wave sources used were the sun, iron core and air core solenoids at 120 VAC and 24 VAC respectively using 1 amp of current at 60 cps, air core solenoids at 45 VDC and 0.5 amp MAX using a standard function generator and amplifier circuit operating at 1,000 cps-500,000 cps, a spark gap and storage capacitor assembly with 35,000 of at 240 VDC, and a Bushnell radar gun with a constant output magnitude approximately ¼ watt in the 20-40 gigahertz K band.

The diffuse pre-exposure light sources were infrared from heated iron, or frosted light bulbs emitting red, yellow, blue, ultraviolet, and plant grow light bands. Pre-exposure times were varied from 5 seconds to 10 minutes depending on the wattage or estimated wattage of the pre-exposure source.

The following results were obtained. The clearest images were those of the solar disk, possibly due to the parallel condition of radio waves from that source, the stripped emulsion was a 5 mm diameter disk on a 4×5 negative. The images obtained in the laboratory setting were more chaotic in terms of the visual image of the target or source, possibly due to the diverging condition of the generated radio waves compounding the effect of defects in the alloy 6061. The results were, however, consistent with specific variable settings. For example, pre-exposing with infrared only always caused a halo around the stripped emulsion possessed of a definite color, the color determined by the type of B&W film used. When the emission source was two horizontal solenoids one above the other in a plane parallel to the plane of the film oscillating at AM band frequencies, two horizontal bars of stripped emulsion with unstripped emulsion surrounding were obtained.

The following additional results were also obtained. When the spark gap emitter was used, 35,000 of at 240 VDC, every exposure resulted in centered rectangular stripped areas covering 90% of the negative. During the radar gun exposures an Internet search revealed a publication by Corenman, J. et al, "*Radar Reflectors*", that laboratories testing radar reflectors use foam to absorb radar reflected from walls. When a foam background was placed around the reflector or source, stripped emulsion areas resembling smeared disks appear, and range from 1.5-2.5 centimeters in diameter depending on the distance from the reflector or source to the MCU Mark 1c.

In another experiment, conducted by a representative of the Stanford Physics Department and acting in a private capacity, using the same MCU Mark 1c prototype, Bushnell radar gun, Efke EFPL50M4550 PL 50 M black-and-white film pre-exposed uniformly to a 60 watt diffuse light source for 10 seconds, and with all darkroom procedures performed by the aforementioned personnel skilled in this procedure. Two additional controlled exposures using the setup described above were conducted by the inventors in the presence of the aforementioned representative to verify that the radar waves were (1) penetrating the metal lens and (2) having the effect of making the film emulsion more reactive to the developing chemical. Images established on the film were verified by the aforementioned Stanford representative in a statement submitted in the parent to the present application.

Advantages and Uses of the Magnegraphic Device

Some of the uses of the magnegraphic embodiments are described in the following descriptions.

1. Radio Astronomy

The magnegraphic lens embodiments will provide superior resolution with a single magnegraphic lens replacing an entire array of parabolic dishes. For example, a set of one or more magnegraphic lenses in the bi-convex configuration may be used to focus the radio waves radiating from stars onto a translation medium. In addition, an optional bi-concave lens could be used in combination with a bi-convex lens to eliminate the radio wave equivalent of chromatic distortions.

2. Medicine

The magnegraphic lens embodiments will provide a method of viewing the interior of the human body with a procedure as harmless as five minutes of exposure to direct sunlight. For example, a magnegraphic lens in the bi-convex configuration may be used to detect radio waves passing through the body to observe opacity variations indicative of conditions within the body, or radio waves reflecting from parts of the body, wherein the radio waves passing through or reflecting are focused onto the translation medium.

3. Geology

The magnegraphic lens embodiments may provide geologists with an additional tool for locating valuable deposits. For example, a set of one or more magnegraphic lenses in the bi-convex configuration may be used to focus radio waves reflected from the earth indicative of conditions below the surface, as different materials reflect radio waves differently. Such an arrangement may include the bi-convex lens or lenses in combination with one or more other magnegraphic device components, such as the filter configuration or the bi-concave configuration.

4. Security

The magnegraphic lens embodiments can provide a method of viewing the contents of some metal containers such as polished aluminum. For example, a set of one or more magnegraphic lenses in the bi-convex configuration may be used to focus radio waves passing through or blocked by materials within an otherwise visibly opaque structure, such as for use in observing what may be on the other side of a wall or within a container. The medical application mentioned in the above in portable form may be able to detect non-metal objects in the intestines of a person such as C-4 and detonation cord packets or drug packets.

Ramifications and Scope of Use of the Invention

Embodiments of this invention can be classed as passive devices, that is, they are not energized by electric charges or magnetic fields, etc in order to function. Since radio waves and light waves obey the same physical laws other embodiments can be obtained by applying the principles of optics, which guide the design of devices affecting light, to obtain the desired effect on radio waves. Some examples are a meniscus convex embodiment, meniscus concave embodiment, Fresnel embodiment, and the like but are not limited thereto. Also an embodiment may be used in aggregate combination with another embodiment or in combination with other devices to form a useful aggregate device such as magnegraphic telescope, magnegraphic microscope, magnegraphic spectrometer, etc.

A plurality of example embodiments to help illustrate the invention have been described. Nevertheless, it will be understood that various modifications may be made without departing from the spirit and scope of the invention. Accordingly, other embodiments are within the scope of the claims appended hereto.

What is claimed is:

1. A method for providing a solution to the problem of altering the path of a plurality of radio waves generated by, reflecting from, or passing through an object under observation so as to enable the temporary or permanent recording of an image of said object generating, reflecting, or passing said radio waves and where the recording of said image is on a surface area where the pattern of radio wave distribution of said image on said surface area is recorded with one or more radio waves at any given point recorded simultaneously with one or more radio waves at any other given point and/or any point devoid of radio waves, and with the method providing said solution to said problem comprising the steps of:
 a) forming a metal or metal alloy, that is in a transparent state or in a translucent state to said radio waves and wherein said metal or metal alloy has an inherent radio wave refraction index greater than a value of one for either said transparent or translucent states, into a geometry used for forming an optical lens or filter creating, a radio wave equivalent lens or filter for a given geometry where said radio wave equivalent lens or filter affects radio waves in the same manner as its optical counterpart affects light, and wherein said geometry has two or more surface areas providing at least one entrance into and at least one exit from said metal or metal alloy for said radio waves; and
 b) positioning said metal or metal alloy in said geometry in the path of said radio waves; and
 c) selectively passing said radio waves through said metal or metal alloy where the transparent state or the translucent state of the metal or metal alloy cause the selection process; and
 d) directing said radio waves through said metal or metal alloy wherein said inherent radio wave refraction index and said geometry in combination direct said image made available by steps a), b), and c) to the surface area of a translation medium for recording.

2. The method as claimed in claim 1 wherein the step of selectively passing includes the step of all radio wave frequencies passing through the transparent metal or metal alloy.

3. The method as claimed in claim 1 wherein the step of selectively passing includes the step of less than all radio wave frequencies passing through the translucent metal or metal alloy.

4. The method as claimed in claim 1 wherein the material is a solid piece of metal or metal alloy.

5. A device for providing a solution to the problem of altering the path of a plurality of radio waves generated by, reflecting from, or passing through an object under observation so as to enable the temporary or permanent recording of an image of said object generating, reflecting, or passing said radio waves and where the recording of said image is on a surface area where the pattern of radio wave distribution of said image on said surface area is recorded with one or more radio waves at any given point recorded simultaneously with one or more radio waves at any other given point and/or any point devoid of radio waves, and wherein said device providing said solution to said problem is composed of a metal or metal alloy comprising:
 (a) a metal or metal alloy that is in a transparent state to said radio waves passing all radio wave frequencies; or
 (b) a metal or metal alloy that is in a translucent state to said radio waves passing some but not all radio wave frequencies; and
 (c) has an inherent radio wave refraction index greater than a value of one for its transparent state or its translucent state;

where said metal or metal alloy has two or more surface areas providing at least one entrance into and at least one exit from said metal or metal alloy for said radio waves, and said metal or metal alloy is formed in a geometry used for forming an optical lens or filter creating a radio wave equivalent lens or filter for a given geometry, and said radio wave equivalent lens or filter affects radio waves in the same manner as its optical counterpart affects light, where said inherent radio wave refraction index and said geometry in combination direct a radio wave image made available by the device described to the surface area of a translation medium for recording.

6. The device as claimed in claim 5 wherein the material is a solid piece of metal or metal alloy.

7. The device as claimed in claim 5, wherein the radio wave equivalent lens is in a bi-convex configuration.

8. The device as claimed in claim 5, wherein the radio wave equivalent lens is in a planar-convex configuration.

9. The device as claimed in claim 5, wherein the radio wave equivalent lens is in a bi-concave configuration.

10. The device as claimed in claim 5, wherein the radio wave equivalent lens is in a planar-concave configuration.

11. The device as claimed in claim 5, wherein the radio wave equivalent lens is in a prism configuration.

12. The device as claimed in claim 5, wherein the radio wave equivalent lens or filter is in a translucent state filter configuration.

13. The device as claimed in claim 5, comprising a plurality of radio wave equivalent lenses and/or filters combined.

14. The device as claimed in claim 5 wherein the material comprises an aluminum or aluminum alloy.

* * * * *